United States Patent [19]

Emgushov

[11] 3,940,699
[45] Feb. 24, 1976

[54] RADIO FREQUENCY ENERGY SIGNALLING APPARATUS

[75] Inventor: Djangar Emgushov, Philadelphia, Pa.

[73] Assignee: Jerrold Electronics Corporation, Horsham, Pa.

[22] Filed: Jan. 14, 1975

[21] Appl. No.: 541,050

[52] U.S. Cl. ............... 325/363; 325/364; 329/192; 328/138; 340/253 R
[51] Int. Cl.² .................. H04B 17/00; G08B 21/00
[58] Field of Search .................. 329/111, 168, 192; 328/132, 135, 137, 138; 325/363, 364, 367; 340/253 R, 253 D, 253 N, 253 P; 178/69 Q, 69 TV

[56] References Cited
UNITED STATES PATENTS

| | | | |
|---|---|---|---|
| 3,437,941 | 4/1969 | Leary | 329/192 X |
| 3,471,792 | 10/1969 | Axford | 329/192 |
| 3,731,203 | 5/1973 | Lieberman | 325/363 |
| 3,769,596 | 10/1973 | Peersch | 328/138 |
| 3,781,692 | 12/1973 | Escoffier | 328/138 |
| 3,875,516 | 4/1975 | Thomas | 328/132 X |

Primary Examiner—Alfred L. Brody
Attorney, Agent, or Firm—John M. Calimafde

[57] ABSTRACT

Portable, plugable electrical test equipment signals the presence or absence of radio frequency energy within a predetermined frequency spectrum, as on a CATV or MATV video distribution system. The equipment comprises a cascaded bandpass filter, radio frequency amplifier, coupling-detector network, and operational amplifier to selectively energize a light emitting diode when a sufficient level of energy in the requisite frequency range is sensed.

In accordance with one aspect of the present invention, the coupling-detector network includes circuitry for quiescently biasing the inverting and noninverting inputs of the operational amplifier to a state such that the LED is not activated. The circuitry further includes as an integral part thereof detector structure for reversing the relative potential amplitudes impressed on the amplifier inputs when a sufficient quantum of the subject radio frequency energy is coupled to the composite test equipment, such that an appropriate output indication is generated.

5 Claims, 1 Drawing Figure

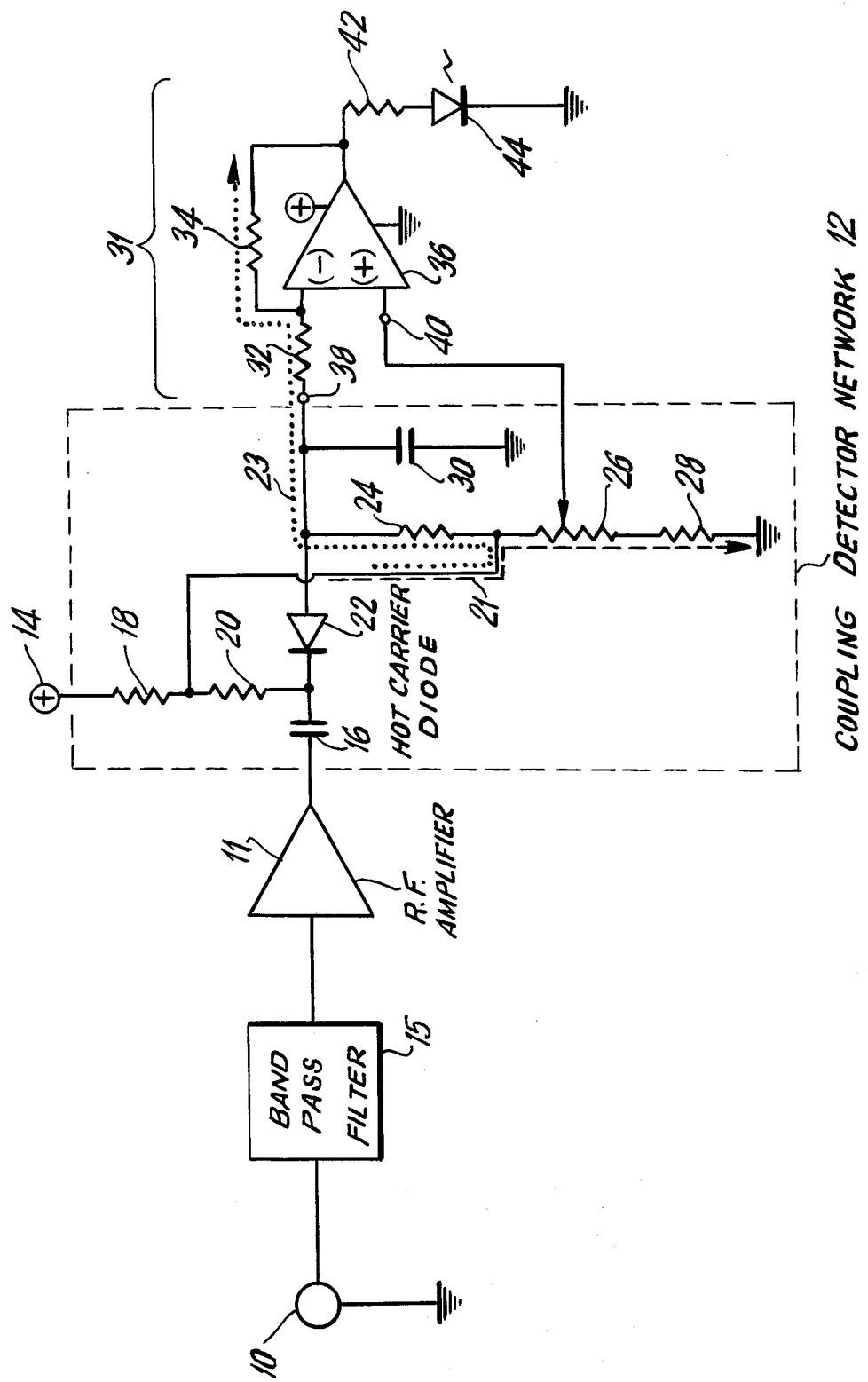

RADIO FREQUENCY ENERGY SIGNALLING APPARATUS

DISCLOSURE OF INVENTION

This invention relates to electronic test equipment and, more specifically, to radio frequency apparatus for signalling the presence of a predetermined radio frequency video signal ensemble.

It is an object of the present invention to provide improved electronic video signal detecting apparatus.

More specifically, it is an object of this invention to provide portable radio frequency apparatus for signalling the incidence of a predetermined video signal or signal ensemble; which may be readily and reliably constructed; and which exhibits a variable detection threshold.

The above and other objects of the present invention are realized in specific illustrative portable test equipment apparatus for signalling the presence or absence of energy of a predetermined radio frequency spectrum in a video distribution CATV or MATV system. The apparatus includes a connector for making a releasable plug connection into a video distribution system, e.g., at tap, splitter or the like. The signals obtaining at the connector junction are supplied to a band-pass filter which passes only energy of the preselected spectrum to a cascaded radio frequency amplifier.

A combined detector-coupling network including a hot carrier detector diode connects the output of the radio frequency amplifier to the inverting and noninverting inputs of an operational amplifier having a light emitting diode (LED) connected to its output. The operational amplifier is quiescently biased (i.e., in the absence of sufficient energy of the subject band) to a state not energizing the LED.

When a sufficient quantum of energy is sensed at the connector input port, such r.f. energy passes through the band-pass filter and radio frequency amplifier and is supplied to the coupling network. The signal is there detected and converted from radio frequency to substantially base band. The detected (negative) signal component reverses the relative amplitudes of the net potentials present at the two operational amplifier input terminals. Accordingly, the amplifier switches to its alternative clamped or saturated state to thereby energize the light emitting diode which hence becomes illuminated, thus signalling the presence of the r.f. signal.

The coupling-detector network includes a potentiometer for varying the response threshold of the amplifier. Accordingly, the composite test apparatus may be adjusted to respond only to signals exceeding a desired minimum size.

The above and other features and advantages of the present invention will become more clear from the present invention detailed description below with respect to a specific illustrative radio frequency spectrum signal detector, illustrated in schematic form in the accompanying drawing.

Referring now to the drawing, there is shown test apparatus for selectively signalling the incidence of a predetermined radio frequency signal component, e.g., a particular video program carrier, or a video band such as the upper radio frequency spectra of channels 7-13. The apparatus includes a connector 10 adapted to plug into a video distribution system at a convenient sampling point, e.g., at a splitter, tap or the like. The signal detected at the connector input port 10 is supplied via a band-pass filter 15 tuned to pass only energy of the frequency spectrum being monitored to a radio frequency amplifier 11.

A coupling-detector network 12 is employed between the output of the amplifier 11, and the inverting and noninverting input terminals 38 and 40 of an operational amplifier circuit 31 which includes a high gain difference amplifier 36. A light emitting diode 44 is connected to the output of the operational amplifier 31, either directly or through a current limiting resistor 42, depending upon the maximum voltage swing of the difference amplifier 36 being employed and the energizing potential being supplied thereto.

As will be more clear from the discussion below, absent a sufficient level of energy in the monitored band present at the connector input port 10, the A.C. (input side) coupling network 12 provides a higher potential to the inverting amplifier input terminal 38 than to the amplifier noninverting input 40. Accordingly, the output of the composite operational amplifier 31 (32-44-36) is at a low level (or ground if that is the negative potential) not sufficient to activate the LED 44. Correspondingly, when a sufficient level of the subject r.f. signal is present at the connector 10, such signal passes through the filter 15, is amplified by element 11, and generates a low frequency (base band or D.C.) voltage in the coupling-detector network 12 which reverses the relative amplitudes of the voltages supplied to the operational amplifier inputs 38 and 40. When this condition obtains the output of the difference amplifier 36 approaches the positive supply voltage, thereby turning the LED 44 on and signalling the presence of energy in the spectrum being monitored.

The particular manner in which the coupling-detector network 12 operates will now be considered. On a quiescent basis, in the absence of the subject radio frequency signal, positive potential is supplied as by battery 14 and coupled to a junction point through a resistor 18. The potential at the lower end of resistor 18 undergoes voltage division in a first circuit path 21 comprising a potentiometer 26 and a resistor 28 (shown dashed in the drawing). The reduced potential at the variable tap point of the potentiometer 26 is directly applied at the noninverting input 40 of the operational amplifier 31.

Correspondingly, the potential at the lower end of resistor 18 is also impressed upon a resistive voltage division circuit (shown by the dotted path 23 in the drawing) - essentially comprising the series connection of resistors 24, 32 and 34. Because the feedback resistor 34 in the high gain composite operational amplifier configuration 31 is very much larger in resistance value than the other resistors serially connected thereto, substantially all of the voltage present at the lower end of the resistor 18 is developed thereacross. Accordingly, substantially the entire potential at the lower end of the resistor 18 obtains at the inverting operational amplifier input terminal 38. The potential at terminal 38 thus exceeds (i.e., is more positive) than that at the noninverting input 40. Because of the large gain of the operational amplifier, the output of amplifier 36 is thereby clamped at its negative most potential, thus not illuminating the light emitting diode 44.

When the composite test equipment shown in the drawing is connected to a video distribution system, and assuming no radio frequency energy in the subject spectrum is present, the LED 44 is not illuminated for reasons above stated. However, if such radio frequency energy is detected, it passes through the band-pass filter 15, and is amplified in element 11. The amplified radio frequency energy is passed by a coupling capacitor 16 and is developed across the series resistors 20 and 18, from which point it is half wave rectified by a detector diode 22. The diode 22 preferably comprises a hot carrier diode device which exhibits a low conductive threshold.

The alternating current radio frequency signal half wave rectified by the detector diode 22 is converted to a low frequency, base band potential by serial resistors 24, 26 and 28 and a shunt capacitor 30. The elements 22, 24, 26, 28 and 30 therefore act as a form of negative radio frequency peak detector, to develop a negative signal contribution between the amplifier inverting input 38 and ground. The full measure of the detected signal (negative) therefore decrements the quiescent potential initially present at the amplifier inverting input 38, while only a portion thereof (that between the tap of potentiometer 26 and ground effected by voltage division) decrements the potential initially present at the amplifier noninverting input 40. Accordingly, assuming the input subject radio frequency amplifier to be of a sufficiently large potential, the voltage at the operational amplifier inverting input 38 decreases below that of the amplifier noninverting input 40, such that the terminal 40 becomes positive relative to the terminal 38.

As long as this condition obtains, the high gain operational amplifier configuration switches state such that its output approaches the potential of the positive voltage source, thereby turning the light emitting diode 44 on, signalling the presence of the subject radio frequency signal. It is observed that the level of radio frequency signal required to turn the light emitting diode 44 on depends upon the setting of the potentiometer 26. Thus the portable test apparatus of the drawing may be readily adjusted to respond only to video signals above any predetermined desired level.

The above described arrangement is merely illustrative of the principles of the present invention. Numerous modifications and adaptations thereof will be readily apparent to those skilled in the art without departing from the spirit and scope of the present invention.

What is claimed is:

1. In combination in radio frequency signal detecting apparatus for signalling the incidence of radio frequency energy of a predetermined spectrum exceeding a preselected adjustable threshold, an operational amplifier having inverting and noninverting input terminals and an output terminal, said operational amplifier including a difference amplifier having inverting and noninverting input terminals and an output terminal, said noninverting input terminal of said difference amplifier corresponding to said noninverting input terminal of said operational amplifier and said output terminal of said difference amplifier corresponding to said output terminal of said operational amplifier, a first resistor connected between the inverting input terminals of said operational amplifier and said difference amplifier and a second resistor connector between said inverting input and output terminals of said difference amplifier, a light emitting diode connecting to the output of said operational amplifier, and a coupling-detector network connected to the inverting and noninverting input terminals of said operational amplifier, said coupling-detector network including an input terminal, a third resistor and a potentiometer connecting said operational amplifier inverting input terminal to a fixed potential, means connecting the tap of said potentiometer to said operational amplifier noninverting input terminal, a capacitor connected in parallel with said third resistor and potentiometer, a detector diode connected between said coupling-detector network input terminal and the inverting input terminal of said operational amplifier, a potential source, and a fourth resistor connecting said potential source to the junction between said third resistor and said potentiometer.

2. A combination as in claim 1, further comprising a fifth resistor connected to said diode, and an additional capacitor connecting said fifth resistor-diode junction with said input of said coupling-detector network.

3. A combination as in claim 2, where said signal detecting apparatus further comprises an input port, and a band-pass filter and radio frequency amplifier serially connected between said input port and said input of said coupling-detector network.

4. A combination as in claim 3 wherein said detector diode comprises a hot carrier diode.

5. A combination as in claim 4 wherein said hot carrier diode has its anode connected to said operational amplifier inverting input terminal.

* * * * *